United States Patent
Turcan

(10) Patent No.: US 12,283,970 B2
(45) Date of Patent: Apr. 22, 2025

(54) DIGITAL-TO-ANALOG CONVERTER (DAC) DATA GENERATOR CIRCUIT

(71) Applicant: Microchip Technology Incorporated, Chandler, AZ (US)

(72) Inventor: Gheorghe Turcan, Bucharest (RO)

(73) Assignee: Microship Technology Incorporated, Chandler, AZ (US)

( * ) Notice: Subject to any disclaimer, the term of this patent is extended or adjusted under 35 U.S.C. 154(b) by 210 days.

(21) Appl. No.: 18/101,597

(22) Filed: Jan. 26, 2023

(65) Prior Publication Data

US 2023/0261667 A1 Aug. 17, 2023

Related U.S. Application Data

(60) Provisional application No. 63/303,862, filed on Jan. 27, 2022.

(51) Int. Cl.
*H03M 1/66* (2006.01)
*H03M 1/06* (2006.01)
*H03M 1/10* (2006.01)

(52) U.S. Cl.
CPC ............ *H03M 1/66* (2013.01); *H03M 1/0626* (2013.01); *H03M 1/10* (2013.01)

(58) Field of Classification Search
CPC ......... H03M 1/66; H03M 1/0626; H03M 1/10
See application file for complete search history.

(56) References Cited

U.S. PATENT DOCUMENTS

2014/0266833 A1* 9/2014 Kris ........................ H03M 1/66
341/144

OTHER PUBLICATIONS

Sharma, Ashok et al., "Design and Implementation of a Re-Configurable Versatile Direct Digital Synthesis-Based Pulse Generator," IEEE Transactions on Instrumentation and Measurement, vol. 70, 14 pages, Jul. 2, 2021.
International Search Report and Written Opinion, Application No. PCT/US2023/011683, 12 pages, May 22, 2023.

* cited by examiner

*Primary Examiner* — Joseph J Lauture
(74) *Attorney, Agent, or Firm* — SLAYDEN GRUBERT BEARD PLLC

(57) ABSTRACT

A device having a digital-to-analog converter (DAC) data generator circuit to perform a function upon an event and generate digital DAC data based on the function and the event, and a DAC circuit to generate an analog waveform signal from the digital DAC data.

20 Claims, 9 Drawing Sheets

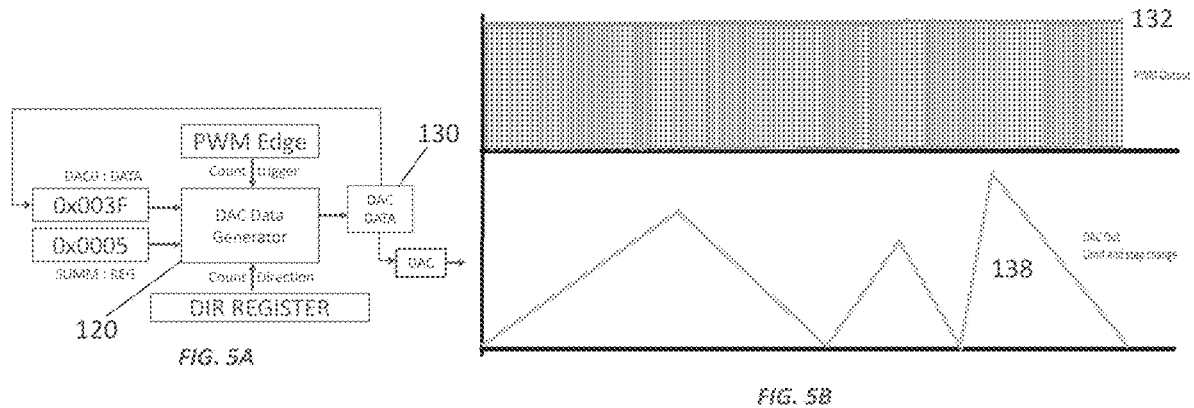

DIGITAL-TO-ANALOG CONVERTER (DAC) DATA GENERATOR CIRCUIT

RELATED APPLICATION

This application claims priority to commonly owned U.S. Provisional Patent Application No. 63/303,862 filed Jan. 27, 2022, the entire contents of which are hereby incorporated by reference for all purposes.

TECHNICAL FIELD

The present disclosure relates to managing access to digital-to-analog converters (DAC), and more particularly to a DAC data generator circuit having processor-independent functionality with hardware functions at an input data register.

BACKGROUND

A conventional digital-to-analog converter (DAC) used for generating time-domain variable analog representations typically has a look-up table for digital input values, which uses substantial memory and processor resources, including significant interrupt time usage to continuously change the digital input values. For example, a processor may need to access the look-up table for each successive digital input value. A conventional internal DAC peripheral typically cannot be linked dynamically to operate without a microcontroller unit (MCU) core intervention during run-time.

Conventional DAC signal generators may be disadvantageous because they use a relatively high amount of memory to support a large look-up table. Further, the MCU core may be interrupted relatively often due to many supporting functions such as: offset, amplitude, phase, sampling rate, and frequency calculations.

There is a need for a DAC peripheral with capabilities independent of an MCU so that the DAC reduces MCU memory and runtime core utilization.

SUMMARY

According to an aspect, there is provided a device comprising a digital-to-analog converter (DAC) data generator circuit to perform a function upon an event and generate digital DAC data based on the function and the event, and a DAC circuit to generate an analog waveform signal from the digital DAC data.

An aspect provides a method comprising performing a function upon an event via a digital-to-analog converter (DAC) data generator circuit, generating digital DAC data based on the function and the event, and generating an analog waveform signal from the digital DAC data via a DAC circuit.

BRIEF DESCRIPTION OF THE DRAWINGS

The figures illustrate example methods, design flows, and systems for high level synthesis (HLS) mapping.

FIG. 5A shows a block diagram of an example DAC-based signal generator of a triangular analog waveform.

FIG. 5B shows graphs of PWM output of the count trigger and DAC output of the example DAC-based signal generator shown in FIG. 5A, wherein the output is a triangular analog waveform.

Figure 1:
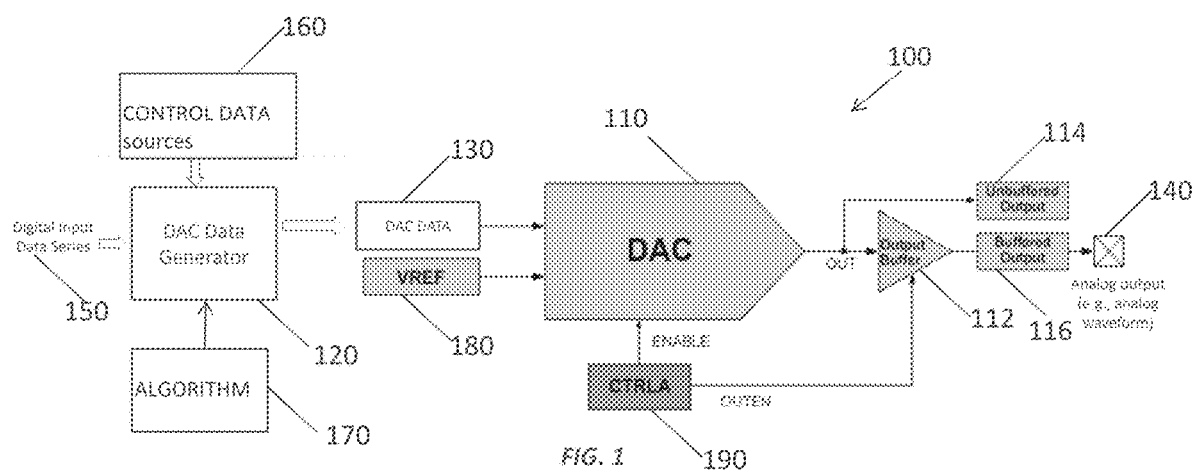
FIG. 1 shows a block diagram of an example DAC-based signal generator having a DAC data generator circuit and a DAC circuit.

The reference number for any illustrated element that appears in multiple different figures has the same meaning across the multiple figures, and the mention or discussion herein of any illustrated element in the context of any particular figure also applies to each other figure, if any, in which that same illustrated element is shown.

DESCRIPTION

The present disclosure provides DAC signal generators having MCU processor-independent functionality. Some examples provide an enhancement of an MCU core independent capabilities of a DAC peripheral, e.g., by providing a digital modification/addition to an existing DAC. Some examples provide functions, e.g., embodied in digital data processing circuitry upstream of the DAC, for providing a digital input stream to the DAC (DAC "DATA" register) that provide more freedom from the MCU core. Some example functions include: "synchronous cloning" of selectable registers, "behavioral event" link to other peripherals, and "controlled step" increments/decrements. DAC signal generators may be independent of the MCU core and perform during sleep with a timing source, which may decrease the system power consumption when compared to a traditional DAC performing the same function. In one aspect, the timing source may have a frequency of 32.768 KHz.

Some examples provide a DAC that operates as an MCU core-independent (or substantially independent) dynamic peripheral. In some examples, a designated register value is cloned to a DAC "DATA" register. Digital data processing circuitry upstream of the DAC can perform a SUMMING function (or other mathematical operation) of a value from a selectable register to the DAC "DATA" register. A digital input data series may comprise first and second digital input values and the mathematical operation may be performed on the first and second digital input values. A mathematical operation, such as adding or subtracting, can be conditioned through events or other peripheral logic status. As a result, the DAC can generate time-domain variable analog representations substantially without MCU core supervision.

The DAC may clone a designated register value to the DAC "DATA" register. The DAC may do a SUMMING function of a value from a selectable register to the DAC "DATA" register. A digital input data series may comprise first and second digital input values and the mathematical operation may be performed on the first and second digital input values. Mathematical operations, such as adding or subtracting, may be conditioned through events or other peripheral logic status. The DAC may generate time-domain variable analog representations without MCU core supervision. The DATA register may enhance the independent capabilities of the DAC peripheral, provide functions such as synchronous cloning of selectable registers, provide a behavioral event link to other peripherals, and enable controlled step increments. The DAC may have a wide band of applications which can free more MCU memory and run-time MCU core utilization.

FIG. 1 shows a block diagram of an example DAC-based signal generator 100. The DAC-based signal generator 100 includes a DAC circuit 110 and a DAC data generator 120 upstream from the DAC circuit 110, the DAC data generator 120 for generating DAC data stored in a DAC data register 130 provided as input to the DAC circuit 110 to generate an analog output waveform 140. A reference voltage VREF 180 is also input to the DAC circuit 110. The DAC circuit 110 may produce an unbuffered output 114 or a buffered output 116 through an output buffer 112. A controller CTRLA 190 enables the DAC circuit 110 and provides an output enable signal to the output buffer 112. At least one digital input data series 150 may be fed to the DAC data generator 120. The DAC data generator 120 may be a function block that adds a capability to the DAC circuit 110. The DAC data generator 120 may include circuitry to process the digital input data series 150 according to (a) a defined algorithm 170 (e.g., mathematical operations such as summing function or subtraction function) and (b) control data sources 160. The digital input data series 150 may comprise first and second digital input values and the mathematical operation of the defined algorithm 170 may be performed on the first and second digital input values. The control data sources 160 may be received from at least one control data source, to generate DAC data stored in DAC data register 130 to supply to the DAC circuit 110. The control data sources 160 may include an internal selectable register clone, a controlled step increment or decrement, or an event triggered action. The control data sources 160 may include internally selectable registers (other peripherals registers) to be linked (these linked registers are used by algorithm 170, described below), a configurable register used as a step increment or decrement value, and links to timing and event sources that are used by algorithm 170 to obtain specific results.

The DAC data generator 120 implements automatic event driven changes to DAC DATA 130 register The changes can be seen as functions, for example: "selectable register clone," "event driven step increment/decrement," or "event linked direction and trigger."

DAC circuit 110 may be implemented by instructions for execution by a processor, analog circuitry, digital circuitry, control logic, digital logic circuits programmed through hardware description language, application specific integrated circuits (ASIC), field programmable gate arrays (FPGA), programmable logic devices (PLD), or any suitable combination thereof, whether in a unitary device or spread over several devices. DAC circuit 110 may be implemented by instructions for execution by a processor through, for example, a function, application programming interface (API) call, script, program, compiled code, interpreted code, binary, executable, executable file, firmware, object file, container, assembly code, or object. For example, DAC circuit 110 may be implemented by instructions stored in a non-transitory medium such as a memory that, when loaded and executed by a processor such as a virtual DAC emulated on a processor, cause the functionality of DAC circuit 110 described herein.

DAC data generator 120 may be implemented by instructions for execution by a processor, analog circuitry, digital circuitry, control logic, digital logic circuits programmed through hardware description language, application specific integrated circuits (ASIC), field programmable gate arrays (FPGA), programmable logic devices (PLD), or any suitable combination thereof, whether in a unitary device or spread over several devices. DAC data generator 120 may be implemented by instructions for execution by a processor through, for example, a function, application programming interface (API) call, script, program, compiled code, interpreted code, binary, executable, executable file, firmware, object file, container, assembly code, or object. For example, DAC data generator 120 may be implemented by instructions stored in a non-transitory medium such as a memory that, when loaded and executed by a processor, so as to implement a virtual DAC data generator emulated on a processor, cause the functionality of DAC data generator 120 described herein.

Figure 2:
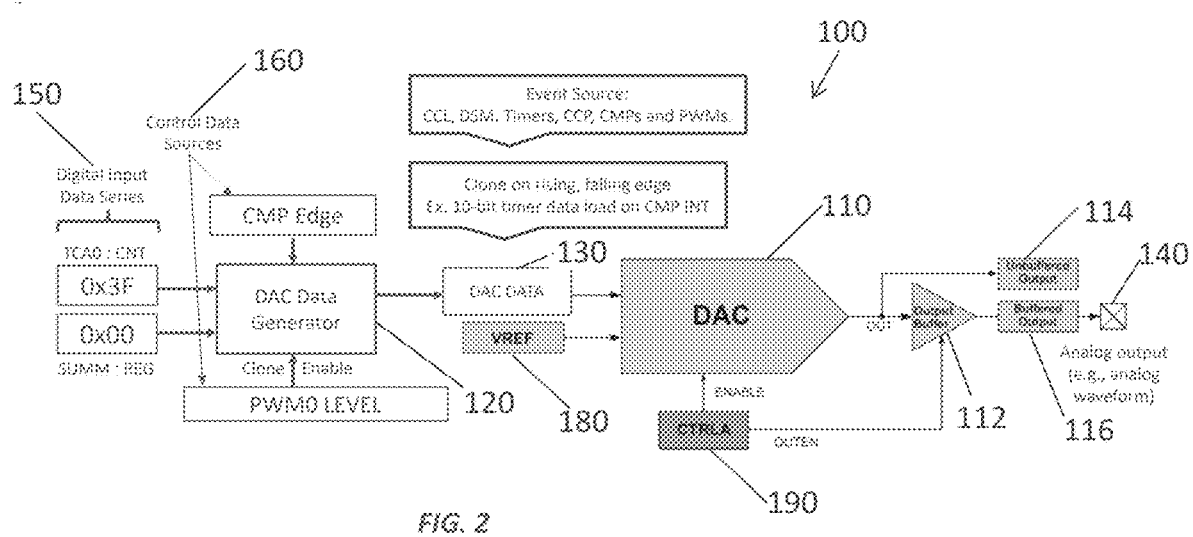
FIG. 2 shows a block diagram of an example DAC-based signal generator having a DAC data generator circuit and a DAC circuit, wherein a digital input data series is from registers and event data is provided by control data sources.

FIG. 2 shows a schematic diagram of one example implementation of the DAC-based signal generator 100 shown in FIG. 1, in which a selected register is cloned (copied) as input for the DAC data generator 120. A selectable register clone may have a trigger and an enabler. A selectable register clone may be a link to a register containing data that may be cloned. In this function, the DAC "DATA" register 130 is a clone of the value of a selected register on each update trigger. Example sources of digital input data series 150 include selectable registers, such as a timer "CNT" register and an analog-to-digital converter ADC "DATA" register. An example may be to clone the CNT register of the Timer Counter A (TCA0.CNT) at each comparator output (CMP) rising edge event while the pulse width modulation output (PWMO) level is "1". The term cloning the register as used herein means copying the value, and in the present examples may be done by DAC Data Generator 120 reading the TCA0: CNT register and adding a 0 value, obtained from the SUMM:REG, and placing the resultant value in DAC Data register 130. The cloning is accomplished responsive to the clone enable output of PWMO LEVEL, e.g. responsive to a predetermined level of the clone enable output of PWMO LEVEL. Clone timing inputs from the control data sources 160 may include: comparator event data, configurable custom logic (CCL) event data, data signal modulator (DSM) event data, input/output (I/O) event data, pulse width modulation (PWM) event data, capture/compare/PWM (CCP) event data, timer event data, and clock frequency (FCLK) event data. In one example, a timer count (CNT) register is cloned and input to the DAC data generator 120 as a first digital input data series 150, along with a predefined summation register as a second input digital input data series 150 (e.g., including a constant value). The summation register (SUMM:REG) may be a register in which any value may be stored to be used as an input for the summing function. For example, if a "0" value is stored in the summation register, the summing function will add whatever value is in the timer count register (TCA0: CNT) with "0". The result will be the CNT register value, which is the cloning value. The DAC data generator 120 sums the two digital input data series 150, and controls the output of resulting values (as DAC DATA stored in DAC data register 130) based on two control inputs: CMP edge, and PWMO Level from control data sources 160. Inputs from the control data sources 160 are used as timing and enable sources for the cloning process, they are not part of the input or output value of 120. According to one aspect, the CNT register may be cloned every 10 us to give the DAC output enough time to generate analog representations of the digital values. The CNT register may be cloned at a rate fast enough to allow the DAC to keep pace with the fast changing register values.

As shown in FIG. 2, according to one aspect, inputs from the digital input data series 150 may be cloned on the rising edge or the falling edge of the comparator output (CMP). The CMP may work as a timing source, and the PWMO level may work as a cloning enable, i.e., clone TCA0: CNT every CMP falling edge while PWMO level is "1".

Figure 3:
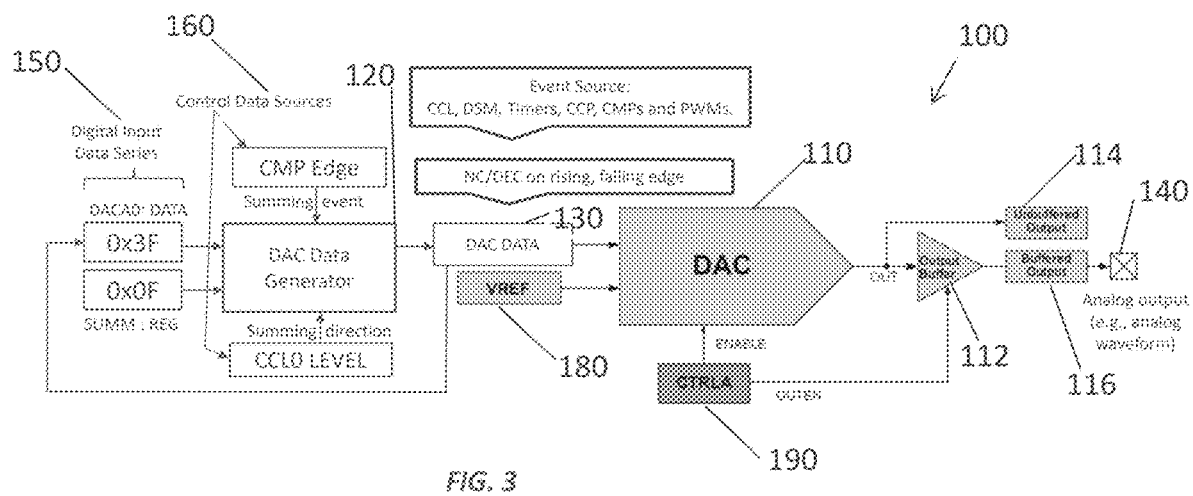
FIG. 3 shows a block diagram of an example DAC-based signal generator having a DAC data generator circuit and a DAC circuit, wherein DAC data is fed back to digital input data series registers.

FIG. 3 shows another example implementation of the DAC-based signal generator 100 shown in FIG. 1. The DAC DATA register 130 is incremented or decremented with a trigger and a direction, in particular, a selectable value on each event selection, by supplying the DAC DATA from the DAC DATA register 130 as feedback to the DAC data generator 120. The selectable value to increment or decrement may be stored in a dedicated increment or decrement (INC/DEC) register, a timer "CNT" register, or an analog-to-digital ADC "DATA" register. INC/DEC timing and level enablers may include: comparator event data, CCL event data, DSM event data, I/O event data, PWM event data, CCP event data, timer event data, or clock frequency event data (FCLK). A clock frequency event may be based on a MCU internal clock timing source. A selectable value may increment on every trigger while an enabler is at a predetermined level. In one example, the value of a (DACA0) register is cloned (illustrated as having a value of 0x3F) and input to the DAC data generator 120 as a first digital input data series 150, along with a predefined summation register (e.g., including a constant value (illustrated as 0x0F)). The DAC data generator 120 sums the two digital input series 150, and controls the output of resulting values (as DAC DATA stored in DAC data register 130) based on two control data sources 160: a summing event is CMP edge, and a summing direction is the output logic level of the CCL0 (i.e. if CCL0 output is "0"-decrement; CCL0 output is "1"-increment). A CMP edge event is a comparator's output transition from a "0" logic state to a "1" logic state (rising edge) or a comparator's output transition from a "1" logic state to a "0" logic state (falling edge). The first digital input data series 150 may be incremented with the value of 0x0F, i.e. by the second digital input data series 150, from an increment or decrement "INC/DEC" register on each CMP rising event while the CCL0 output is on level "1". A shown in FIG. 3, the INC/DEC register is an example of the SUMM:REG register of the digital input data series 150.

FIGS. 4A-8B illustrate example analog waveforms that can be generated by an example DAC-based signal generator 100.

Figures 4A, 4B:
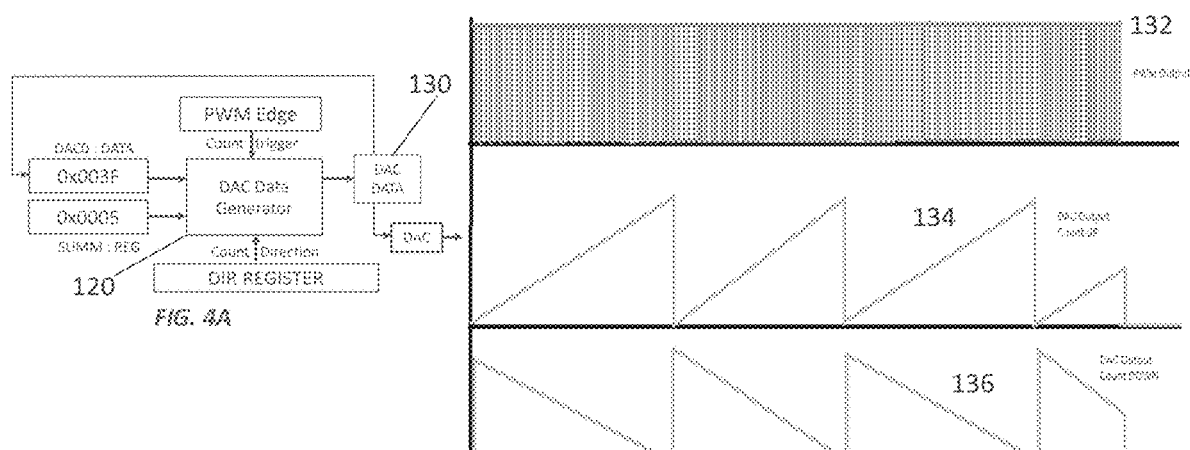
FIG. 4A shows a block diagram of an example DAC-based signal generator of a sawtooth analog waveform.
FIG. 4B shows graphs of a PWM output of the count trigger and DAC output of the example DAC-based signal generator shown in FIG. 4A, wherein the output is sawtooth.

FIGS. 4A and 4B illustrate an example generation of a sawtooth waveform using an example DAC-based signal generator 100 according to the present disclosure. FIG. 4A shows an example of DAC-based signal generator 100 to generate a sawtooth signal as digital DAC data from DAC data register 130 (see FIG. 1). In particular, the DAC0: DATA register is linked to the DAC DATA register 130 (illustrated as having a value of 0x003F) and input to the DAC data generator 120, along with a predefined summation register (SUMM:REG) illustrated as having a value of (0x0005). The count triggers on a PWM edge and the count direction is stored in a direction register, DIR REGISTER. In other words, the count is on the direction selection in the DIR register on each PWM output edge or count trigger. The slope of the ramp of the sawtooth signal is controlled by the increment or decrement (INC/DEC) register (SUMM:REG) and the PWM frequency. The DAC Data generator 120 shown in FIG. 4A produces DAC data shown in FIG. 4B, wherein FIG. 4B shows the analog representation of the digital values from the DAC data register 130, particularly an example a DAC output count up 134 and an example DAC output count down 136 as analog outputs (e.g., examples of analog output 140 of FIG. 1. The PWM output 132 in FIG. 4B represents the PWM Edge count trigger (160 in FIG. 3), the DAC output count up 134 is the analog output in a "Count UP" configuration (or adding SUMM:REG to DAC0:DATA at DAC data generator 120 input), and DAC output count down 136 is the analog output in a "Count DOWN" configuration (or subtracting SUMM:REG from DAC0:DATA at DAC data generator 120 input). Register overflow may cause the clear, or alternately a manual clear can be performed.

FIGS. 5A and 5B illustrate an example generation of a triangular waveform using an example DAC-based signal generator 100. The triangular waveform may be based on a PWM, a rising edge count up, a change count direction on limit reach, and a counting steps change, wherein the counting steps may be the value in the INC/DEC register (SUMM:REG). FIG. 5A shows a triangular waveform signal generation configuration for the input of the digital DAC data 130. In particular, the value of a DAC0:DATA register is cloned (0x003F) as input to the DAC data generator 120, along with a predefined summation register (SUMM:REG) illustrated as having a value of 0x0005). The count triggers on PWM edge and the count direction is responsive to the value stored in DIR REGISTER. In other words, addition or subtraction of the SUMM:REG to/from DAC0:DATA is decided by the value in "DIR REGISTER" while the summing frequency is decided by "PWM edge". A slope of the ramp of the triangular signal is controlled by the INC/DEC register (SUMM:REG) and the PWMO frequency. The counting direction input may be a value stored in a register, a digital compare value of the contents of DAC DATA register 130 vs. a DAC OUT LIMIT to generate a logic output, or an actual logic output generator (e.g. CCL) to compare the compare value of the contents of DAC DATA register 130 vs. a DAC OUT LIMIT, without limitation. The counting direction may be controlled from another peripheral, e.g., CCL. The DAC Data generator 120 shown in FIG. 5A produces digital DAC data shown in FIG. 5B, wherein FIG. 5B shows the analog representation of the digital values from the DAC data register 130 such that the DAC OUT LIMIT and a step change 138 is an analog output, with the step change a result of changing the value stored in SUMM:REG. The PWM output 132 in FIG. 5B represents the PWM Edge count trigger (see FIG. 5A) . . . . The DAC data generator 120 may create a trapezoidal wave by using a Digital Signal Modulation (DSM) over the count enable register by adding counting enable pauses.

Figure 6A:
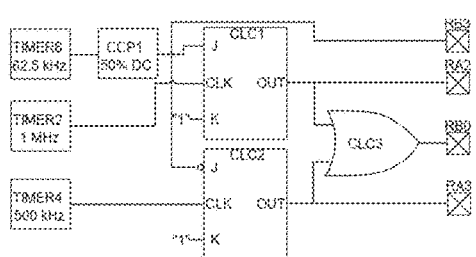
FIG. 6A shows a block diagram of an example count trigger source for the DAC-based signal generator that can be used to obtain a trapezoidal analog waveform.
Figure 6B:
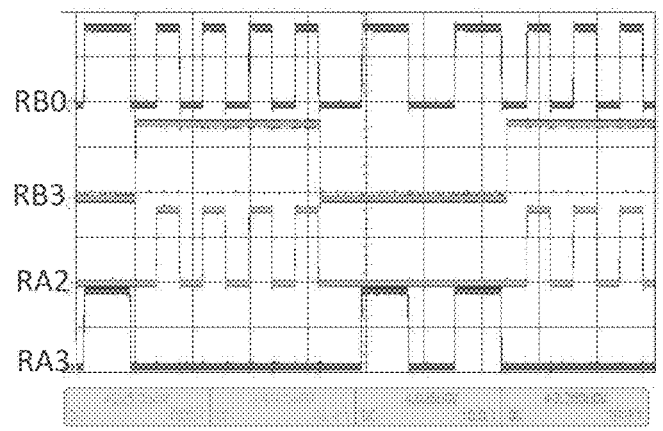
FIG. 6B shows graphs of a PWM output of the count trigger source shown in FIG. 6A, wherein the output is a trapezoidal analog waveform.

FIGS. 6A and 6B illustrate a timing source configuration example for a trapezoidal waveform generation using an DAC-based signal generator 100. The timing waveform may be based on a PWM and DSM/CLC, a count up on edge, and a count down after a counting direction level change. FIG. 6A shows three CLCs, three timers, and a capture/compare/PWM (CCP), together producing four analog outputs (e.g., analog waveforms) (RB3, RA2, RB0, and RA3). CLC1, arranged as a JK flop, receives input J from CCP1, which CCP1 generates a PWM signal based on a period from Timer6 at a 50% duty cycle. CLC1 receives input CLK from Timer2 at 1 MHz, and receives input K set to "1". CLC1 provides its output to RA2 and a first input of CLC3. RB3 may be the output of CCP1, rather than an external input. CLC2, arranged as a JK flop, outputs to RA3 and to a second input of CLC3, receives input CLK from Timer4 at 500 kHz, receives input K set to "1", and receives input J from RB3, inverted. CLC3, arranged as an OR gate, provides its output to RB0. FIG. 6B shows the PWM waveforms for RB3, RA2, RB0, and RA3. RB3, RA2, RB0, and RA3 are then used as timing and direction sources (control data source 160) to obtain a Trapezoidal analog waveform at an output of DAC-based signal generator 100.

Figure 7:
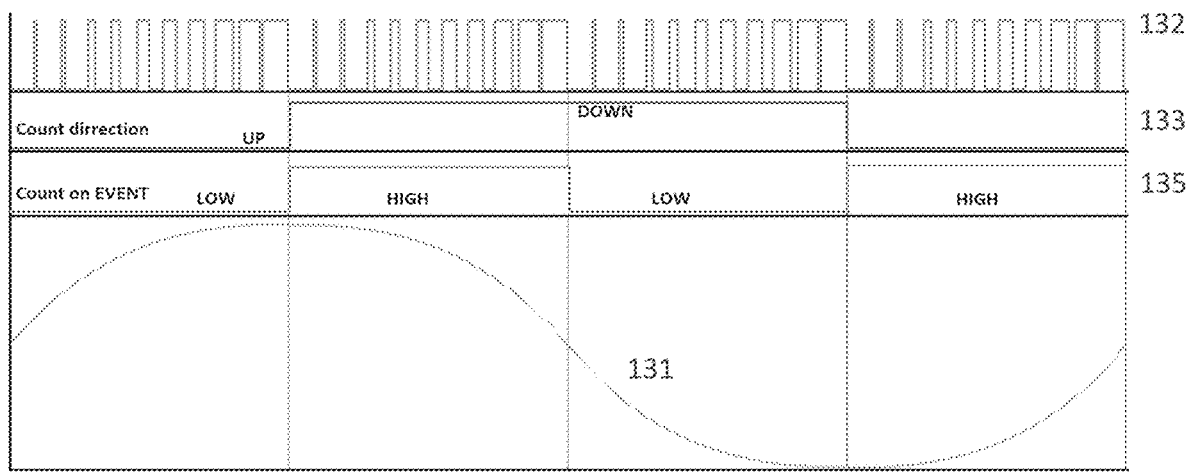
FIG. 7 shows an example generation of a sinusoidal analog waveform using various PWM sources as trigger source, counting direction source and event level source.

FIG. 7 illustrates an example generation of a sinusoidal waveform using an example DAC-based signal generator 100. A variable PWM signal 132, shown as the top of FIG. 7, may be supplied to the DAC data generator 120 as a count enabler, along with count direction control data 133 and count-on event (count on level) control data 135, for generating the sinusoidal waveform 131. A variable PWM signal may be added to a summing enabler input, which may be an example of control data sources 160, to produce a nonlinear waveform, such as a sinusoidal signal waveform.

Figure 8A:
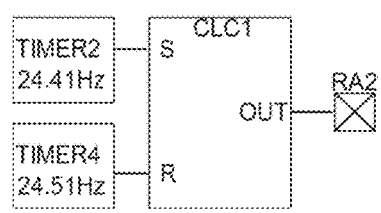
FIG. 8A shows an example circuit for generating a variable PWM signal that can be used as count trigger source in a sinusoidal generation method of the DAC based signal generator.
Figure 8B:
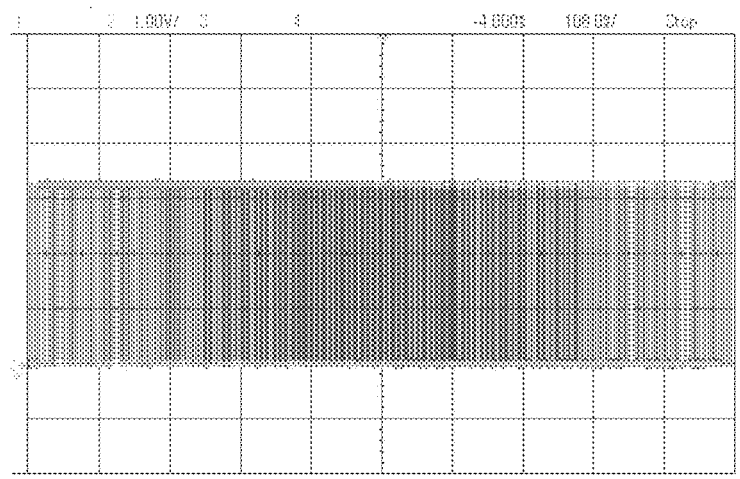
FIG. 8B shows a graph of a variable PWM signal output of the circuit shown in FIG. 8A.

FIG. 8A illustrates an example circuit for generating the variable PWM signal shown in FIG. 8B. CLC1, configured as an RS flip-flop, receives input S from Timer2 at 24.4 Hz and receives input R from Timer4 at 24.5 Hz. CLC1 provides its output to RA2. This output at RA2 may be used to generate sinusoidal signal waveform 131. See FIG. 7. The PWM waveform in FIG. 8B, i.e. the output provided to RA2, added to the "Summing Enabler" input may generate a sinusoidal waveform on the output of DAC-based signal generator 100.

Figure 9:
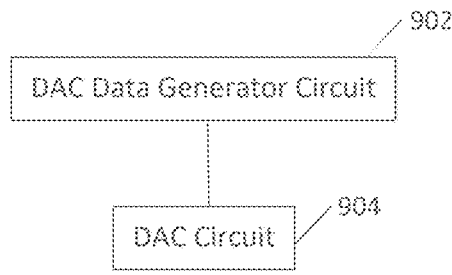
FIG. 9 shows a DAC for processor-independent functionality having a DAC data generator circuit and a DAC circuit.

FIG. 9 shows a DAC-based signal generator having processor-independent functionality. A DAC data generator circuit 902 provides digital data processing circuitry upstream of a DAC circuit 904, for providing a digital input stream to the DAC (DAC "DATA" register) that provide more functionality independent from an MCU. The DAC data generator circuit 902 may be set to: "synchronous clone" selectable registers, "behavioral event" link to other peripherals, or "controlled step" increment or decrement.

Figure 10:
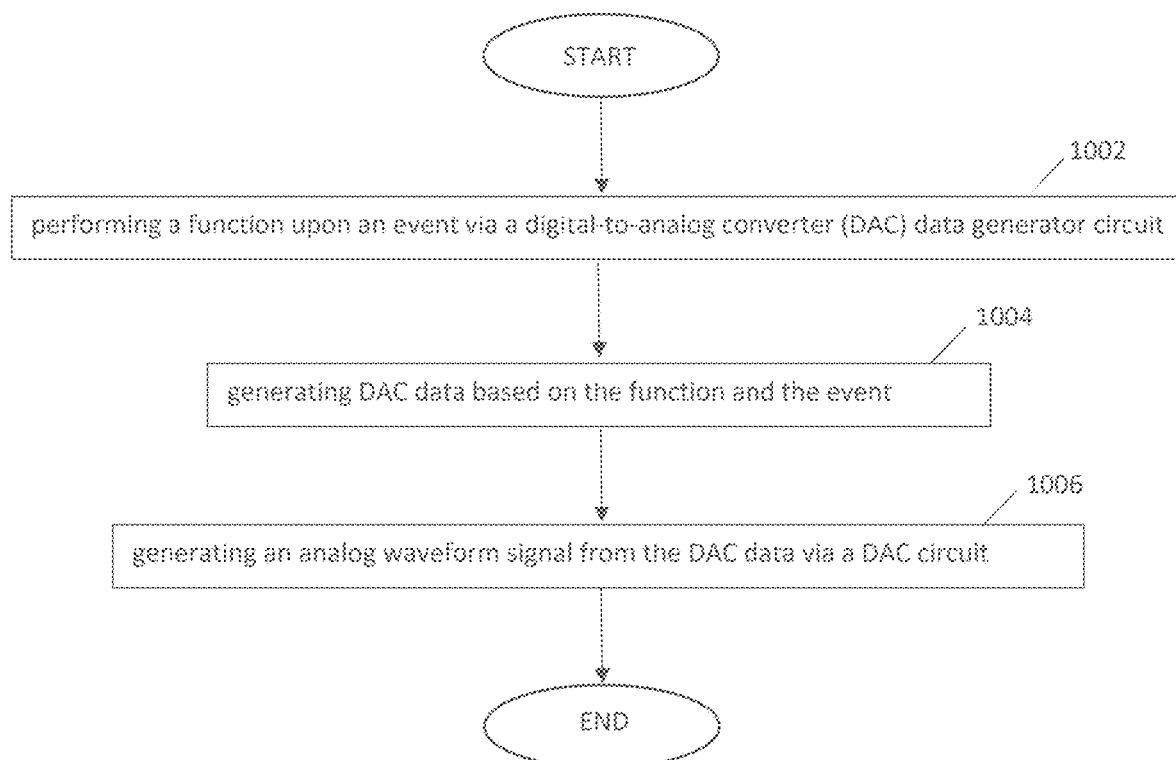
FIG. 10 shows a method for converting digital data to analog data, wherein a function is performed upon an event via a digital-to-analog converter (DAC) data generator circuit, digital DAC data is generated based on the function and the event, and an analog waveform signal is generated from the digital DAC data via a DAC circuit.

FIG. 10 illustrates a method for converting digital data to analog data. According to the method, a function is performed 1002 upon an event via a digital-to-analog converter (DAC) data generator circuit. DAC data is generated 1004 based on the function and the event. An analog waveform signal is generated 1006 from the digital DAC data via a DAC circuit.

Although examples have been described above, other variations and examples may be made from this disclosure without departing from the spirit and scope of these disclosed examples.

The invention claimed is:

1. A device, comprising:
 a digital-to-analog converter (DAC) data generator circuit to:
 perform a function upon an event; and
 generate DAC data based on the function and the event; and
 a DAC circuit to generate an analog waveform signal from the digital DAC data,
 wherein the function is performed on a digital input data series, wherein:
 the digital input data series includes a first digital input value and a second digital input value; and
 generating DAC data comprises performing a mathematical operation on the first digital input value and the second digital input value.

2. The device of claim 1, wherein the function clones a value of a selectable register and the event comprises an event selected from:
 (a) a pulse width modulation (PWM) event,
 (b) a configurable custom logic event,
 (c) a data signal modulator event,
 (d) a capture compare PWM event,
 (e) comparator output (CMP) event, and
 (f) timer event.

3. The device of claim 2, wherein the selectable register is a timer count register.

4. The device of claim 2, wherein the selectable register is an analog-to-digital converter register.

5. The device of claim 2, wherein the function increments, or decrements, a DAC data register with a selectable value and the event comprises an event selected from:
 (a) a data signal modulator event;
 (b) a configurable custom logic event;
 (c) an input, or output, event;
 (d) a pulse width modulation event;
 (e) a timer event;
 (f) a comparator output (CMP) event; and
 (g) a clock frequency event.

6. The device of claim 5, wherein the selectable value is a value stored in an increment or decrement register, a value stored in a timer count register, or a value stored in an analog-to-digital register value.

7. The device of claim 1, wherein the function increments, or decrements, a DAC data register with a selectable value and the event comprises an event selected from:
 (a) a data signal modulator event;
 (b) a configurable custom logic event;
 (c) an input, or output, event;
 (d) a pulse width modulation event;
 (e) a timer event;
 (f) a comparator output (CMP) event; and
 (g) a clock frequency event.

8. The device of claim 7, wherein the selectable value is stored in an increment or decrement register.

9. The device of claim 7, wherein the selectable value is a timer count register value.

10. The device of claim 7, wherein the selectable value is an analog-to-digital converter data register value.

11. The device of claim 1, wherein the analog waveform signal generated from the DAC data is a waveform selected from: a sawtooth waveform signal, a triangular waveform signal, a trapezoidal waveform signal, and a sinusoidal waveform signal.

12. A method, comprising:
performing a function upon an event via a digital-to-analog converter (DAC) data generator circuit;
generating DAC data based on the function and the event; and
generating an analog waveform signal from the DAC data via a DAC circuit,
wherein performing the function is on digital input data series wherein the digital input data series includes a first digital input value and a second digital input value; and
wherein generating the digital DAC data comprises a performing a mathematical operation on the first digital input value and the second digital input value.

13. The method of claim 12, wherein performing the function comprises selecting a register and cloning a value of the selected register and the event comprises an event selected from:
(a) pulse width modulation (PWM) event,
(b) configurable custom logic event,
(c) data signal modulator event,
(d) capture compare PWM event,
(e) comparator output (CMP) event, and
(f) timer event.

14. The method of claim 13, wherein selecting the register comprises selecting a timer count register.

15. The method of claim 13, wherein selecting the register comprises selecting an analog-to-digital converter register.

16. The method of claim 13, wherein performing the function comprises selecting a value and incrementing or decrementing a register with the selected value and the event comprises an event selected from:
(a) data signal modulator event;
(b) configurable custom logic event;
(c) input/output event;
(d) pulse width modulation event;
(e) timer event;
(f) comparator output (CMP) event; and
(g) clock frequency event.

17. The method of claim 12, wherein performing the function comprises selecting a value and incrementing or decrementing a register with the selected value and the event comprises an event selected from:
(a) data signal modulator event;
(b) configurable custom logic event;
(c) input/output event;
(d) pulse width modulation event;
(e) timer event;
(f) comparator output (CMP) event; and
(g) clock frequency event.

18. The method of claim 17, wherein selecting the value comprises selecting a value that is stored in an increment or decrement register.

19. The method of claim 17, wherein selecting the value comprises selecting a timer count register value.

20. The method of claim 17, wherein selecting the value comprises selecting an analog-to-digital converter register value.

* * * * *